United States Patent
Vispute et al.

(10) Patent No.: US 10,630,028 B2
(45) Date of Patent: Apr. 21, 2020

(54) REVERSE OVERCURRENT PROTECTION FOR UNIVERSAL SERIAL BUS TYPE-C (USB-C) CONNECTOR SYSTEMS

(71) Applicant: Cypress Semiconductor Corporation, San Jose, CA (US)

(72) Inventors: Hemant P. Vispute, Bangalore (IN); Partha Mondal, Paschim Medinipur (IN)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 16/017,008

(22) Filed: Jun. 25, 2018

(65) Prior Publication Data

US 2019/0319409 A1 Oct. 17, 2019

Related U.S. Application Data

(60) Provisional application No. 62/681,502, filed on Jun. 6, 2018, provisional application No. 62/656,732, filed on Apr. 12, 2018.

(51) Int. Cl.
*H02H 7/00* (2006.01)
*H02H 9/00* (2006.01)
(Continued)

(52) U.S. Cl.
CPC ....... *H01R 13/6666* (2013.01); *G06F 13/385* (2013.01); *G06F 13/4022* (2013.01);
(Continued)

(58) Field of Classification Search
CPC .................................................. H01R 13/6666
(Continued)

(56) References Cited

U.S. PATENT DOCUMENTS 6,510,485 B1 1/2003 Shin
7,598,715 B1 10/2009 Hariman et al.
(Continued)

OTHER PUBLICATIONS

"NX5P3290 USB PD and type C current-limited power switch," NXP Semiconductors, Rev 1.1, Jun. 13, 2017; 25 pages.
(Continued)

*Primary Examiner* — Thienvu V Tran
*Assistant Examiner* — Lucy M Thomas

(57) ABSTRACT

An electronic device includes a first electronic circuitry portion configured to connect a $V_{CONN}$ supply terminal of a Universal Serial Bus Type-C (USB-C) controller to a first configuration channel (CC) terminal of a plurality of CC terminals of the USB-C controller. The first CC terminal of the USB-C controller is to be directly connected to a first CC terminal of a plurality of CC terminals of a USB-C receptacle. The electronic device further includes a second electronic circuitry portion electrically coupled to the first electronic circuitry portion and configured to detect a voltage across the first CC terminal of the USB-C controller and the $V_{CONN}$ supply terminal. The second electronic circuitry portion is to decouple the $V_{CONN}$ supply terminal from the first CC terminal of the USB-C controller when the voltage is greater than a predetermined threshold.

15 Claims, 5 Drawing Sheets

(51) Int. Cl.
  *H01R 13/66* (2006.01)
  *H03K 19/003* (2006.01)
  *G06F 13/42* (2006.01)
  *H01L 27/02* (2006.01)
  *G06F 13/38* (2006.01)
  *H03K 19/0185* (2006.01)
  *G06F 13/40* (2006.01)

(52) U.S. Cl.
  CPC ...... *G06F 13/4282* (2013.01); *H01L 27/0266* (2013.01); *H03K 19/00315* (2013.01); *H03K 19/018507* (2013.01); *H03K 19/018557* (2013.01)

(58) Field of Classification Search
  USPC .......................................................... 361/18
  See application file for complete search history.

(56) References Cited

U.S. PATENT DOCUMENTS

| | | |
|---|---|---|
| 7,859,240 B1 | 12/2010 | Geynet et al. |
| 8,193,779 B2 | 6/2012 | Ferguson |
| 9,306,520 B2 | 4/2016 | Mathe et al. |
| 9,558,144 B2 | 1/2017 | Nge et al. |
| 9,625,988 B1 | 4/2017 | Agarwal et al. |
| 9,705,307 B2 | 7/2017 | Ji et al. |
| 9,891,684 B2 | 2/2018 | Liu et al. |
| 2007/0081285 A1 | 4/2007 | Takeshita et al. |
| 2008/0204958 A1 | 8/2008 | Shearon et al. |
| 2017/0047731 A1 | 2/2017 | Manohar et al. |
| 2017/0115711 A1* | 4/2017 | Jaramillo ................ G06F 1/266 |
| 2017/0126041 A1 | 5/2017 | Sato |
| 2017/0139467 A1* | 5/2017 | Waters ................. G06F 1/3287 |
| 2017/0317583 A1 | 11/2017 | Forghani-Zadeh et al. |
| 2017/0346240 A1* | 11/2017 | Oporta ................. G06F 13/385 |

OTHER PUBLICATIONS

Griffith, John, "USB Power Switch Reverse Current Protection," Texas Instruments, Feb. 2013; 8 pages.
International Search Report for International Application No. PCT/US2019/026610 dated Jul. 1, 2019, 2 pages.
Written Opinion of the International Searching Authority for International Application No. PCT/US2019/026610 dated Jul. 1, 2019, 5 pages.

* cited by examiner

REVERSE OVERCURRENT PROTECTION FOR UNIVERSAL SERIAL BUS TYPE-C (USB-C) CONNECTOR SYSTEMS

CROSS-REFERENCE RELATED TO APPLICATIONS

This application claims the priority and benefit of U.S. Provisional Application No. 62/656,732, filed on Apr. 12, 2018, and of U.S. Provisional Application No. 62/681,502, filed on Jun. 6, 2018, all of which are incorporated by reference herein in their entirety.

TECHNICAL FIELD

Aspects of the present disclosure generally relate to Universal Serial Bus (USB) Type-C connector subsystems, and more particularly, to reverse current protection for USB Type-C connector subsystems.

BACKGROUND

Various electronic devices (e.g., such as smartphones, tablets, notebook computers, laptop computers, hubs, chargers, adapters, etc.) are configured to transfer power through a Universal Serial Bus Type-C (USB-C) connector system. For example, in some applications an electronic device may be configured as a power consumer to receive power through a USB-C connector system (e.g., for battery charging), while in other applications an electronic device may be configured as a power provider to provide power to another device that is connected thereto through a USB-C connector system. Electronic devices are typically configured to transfer power through Field Effect Transistors (FETs), or other similar switching devices. In some instances, the FETs may become susceptible to electrical damage (e.g., overcurrent damage, overvoltage damage, overheating damage, and so forth) due to, for example, one or more electrical faults possibly occurring on the USB-C connector system.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
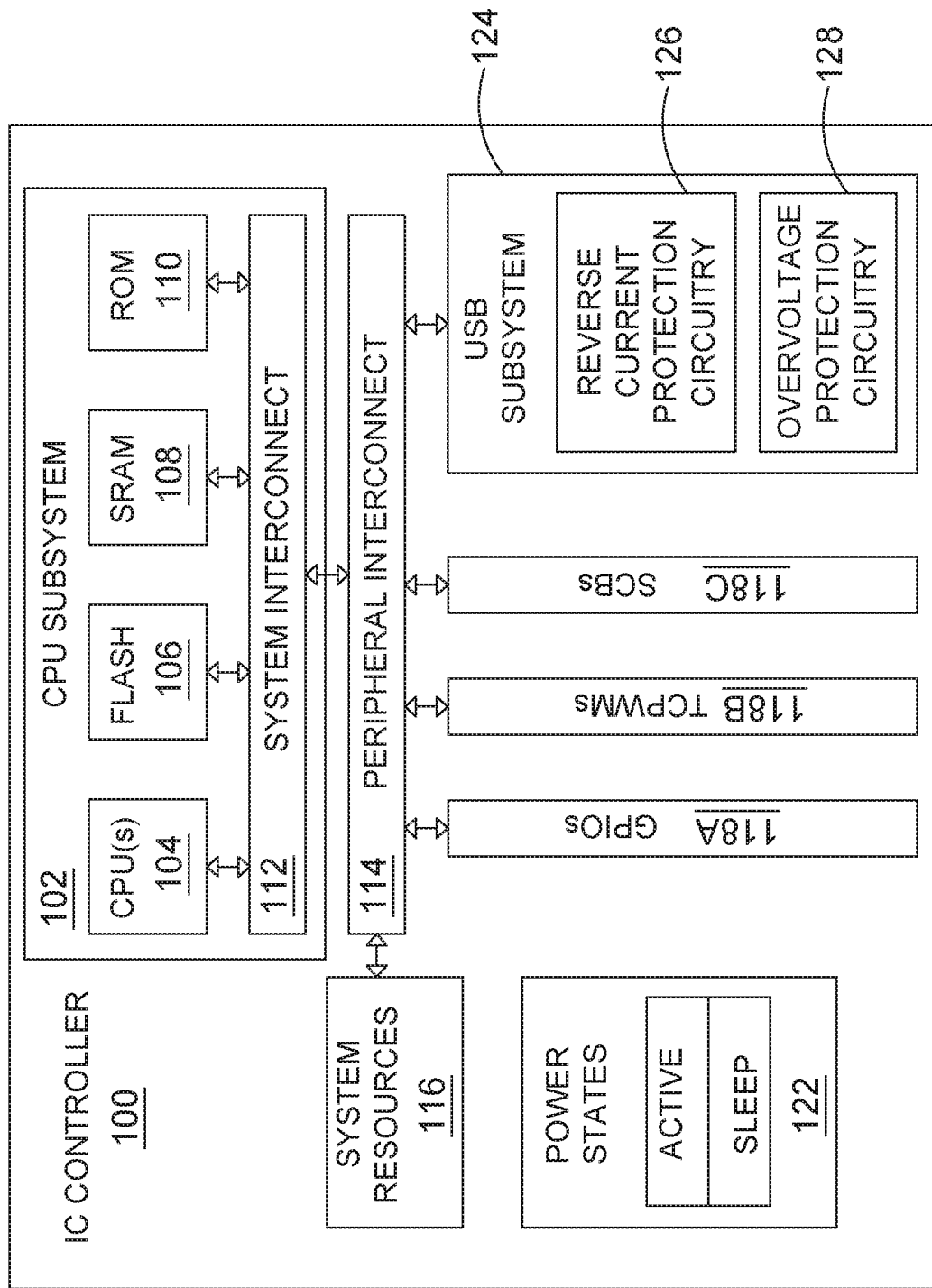
FIG. 1 is a block diagram that illustrates integrated circuit (IC) controller system, in accordance with the present embodiments.

Described herein are various embodiments of techniques for reverse current protection for USB-C in electronic devices. Examples of such electronic devices include, without limitation, personal computers (e.g., laptop computers, notebook computers, and so forth), mobile computing devices (e.g., tablets, tablet computers, e-reader devices, and so forth), mobile communication devices (e.g., smartphones, cell phones, personal digital assistants, messaging devices, pocket PCs, and so forth), connectivity and charging devices (e.g., hubs, docking stations, adapters, chargers, etc.), audio/video/data recording and/or playback devices (e.g., cameras, voice recorders, hand-held scanners, monitors, and so forth), and other similar electronic devices that can use USB connectors (interfaces) for communication and/or battery charging.

As used herein, an electronic device or a system is referred to as "USB-enabled" if the electronic device or system complies with at least one release of a Universal Serial Bus (USB) specification. Examples of such USB specifications include, without limitation, the USB Specification Revision 2.0, the USB 3.0 Specification, the USB 3.1 Specification, and/or various supplements (e.g., such as On-The-Go, or OTG), versions and errata thereof. The USB specifications generally define the characteristics (e.g., attributes, protocol definition, types of transactions, bus management, programming interfaces, and so forth) of a differential serial bus that are required to design and build standard communication systems and peripherals.

For example, a USB-enabled peripheral electronic device attaches to a USB-enabled host device through a USB port of the host device to form a USB-enabled system. A USB 2.0 port may include a power line (e.g. $V_{BUS}$) of 5V, a differential pair of data lines (e.g., which may be denoted D+ or DP, and D− or DN), and a ground line (e.g., GND) for power return. A USB 3.0 port also provides the $V_{BUS}$, D+, D−, and GND lines for backward compatibility with USB 2.0. In addition, to support a faster differential bus (the USB SuperSpeed bus), a USB 3.0 port also provides a differential pair of transmitter data lines (denoted SSTX+ and SSTX−), a differential pair of receiver data lines (denoted SSRX+ and SSRX−), a power line for power (e.g., which may be denoted DPWR), and a ground line for power return (e.g., which may be denoted DGND). A USB 3.1 port provides the same lines as a USB 3.0 port for backward compatibility with USB 2.0 and USB 3.0 communications, but extends the performance of the SuperSpeed bus by a collection of features referred to as Enhanced SuperSpeed.

An emerging technology for USB connectors, called USB Type-C, was recently defined in various releases of the USB Type-C specification. The various releases of the USB Type-C specification define USB Type-C receptacle, plug, and cables that can support USB communications as well as power delivery over newer USB power delivery protocols defined, for example, in one or more revisions USB Power Delivery (USB-PD) specifications.

Some electronic devices may be compliant with a specific release and/or version of the USB Type-C specification. As used herein, a "USB Type-C subsystem" may refer to, for example, hardware circuitry that may be controllable by firmware and/or software in an integrated circuit (IC) controller, which is configured and operable to perform the functions and to satisfy the requirements specified in at least one release of the USB Type-C specification. Examples of such Type-C functions and requirements may include, without limitation, data and other communications according to USB 2.0 and USB 3.0/3.1, electro-mechanical definitions and performance requirements for Type-C cables, electro-mechanical definitions and performance requirements for Type-C receptacles, electro-mechanical definitions and performance requirements for Type-C plugs, requirements for Type-C to legacy cable assemblies and adapters, requirements for Type-C-based device detection and interface configuration, requirements for optimized power delivery for Type-C connectors, and so forth. According to the USB Type-C specification(s), a Type-C port provides VBUS, D+, D−, GND, SSTX+, SSTX−, SSRX+, and SSRX− lines, among others.

In addition, a Type-C port also provides a Sideband Use (e.g., which may be denoted SBU) line for signaling of sideband functionality and a Configuration Channel (denoted CC) line for discovery, configuration, and management of connections across a Type-C cable. A Type-C port may be associated with a Type-C plug and with a Type-C receptacle. For ease of use, the Type-C plug and the Type-C receptacle are designed as a reversible pair that operates regardless of the plug-to-receptacle orientation. Thus, a standard Type-C connector, disposed as a standard Type-C plug or receptacle, provides pins for four VBUS lines, four ground return (GND) lines, two D+ lines (DP1 and DP2), two D− lines (DN1 and DN2), two SSTX+ lines (e.g., SSTXP1 and SSTXP2), two SSTX− lines (SSTXN1 and SSTXN2), two SSRX+ lines (e.g., SSRXP1 and SSRXP2), two SSRX− lines (SSRXN1 and SSRXN2), two CC lines (CC1 and CC2), and two SBU) lines (e.g., SBU1 and SBU2), among others.

Some electronic devices may be compliant with a specific revision and/or version of the USB-PD specification. The USB-PD specification defines a standard protocol designed to enable the maximum functionality of USB-enabled devices by providing more flexible power delivery thereto/therefrom along with data communications over a single Type-C cable through USB Type-C ports. For example, the USB-PD specification describes the architecture, protocols, power supply behavior, parameters, and cabling necessary for managing power delivery over USB Type-C cables at up to 100 W of power. According to the USB-PD specification, USB-enabled devices may negotiate for more current and/or higher or lower voltages over a USB Type-C cable than are defined in older USB specifications. As used herein, "USB-PD subsystem" may, in some embodiments, refer to hardware circuitry that may be controllable by firmware and/or software in an integrated circuit (IC) controller, which is configured and operable to perform the functions and to satisfy the requirements specified in at least one release of the USB-PD specification.

An electronic device typically uses a power-transfer circuit (power path) to transfer power to/from the device. Among other electronic components, a power path may include one or more power-FETs that are coupled in-line on the circuit path to operate as switches (e.g., as "ON"/"OFF" switches). Power-FETs differ in some important characteristics from FETs and other types of transistor switch devices that are used for other, non-power-transfer applications. As a discrete semiconductor switching device, a power-FET needs to carry a large amount of current between its source and its drain while it is "ON", to have low resistance from its source to its drain while it is "ON", and to withstand high voltages from its source to its drain while it is "OFF". For example, a power-FET may be characterized as being able to carry currents in the range of several hundred milliamps (e.g., 500-900 mA) to several amps (e.g., 3-10 A, or higher), and to withstand voltages in the range of 12V to 40V (or higher) across its source to its drain. For example, the resistance between the source and the drain of a power-FET device may be very small (e.g., in order of tens of milli-Ohms) to prevent, for example, the power loss across the device.

FIG. 1 illustrates an example device 100 that is configured in accordance with the techniques for reverse current protection for USB-C circuits described herein. In the embodiment illustrated in FIG. 1, device 100 is an integrated circuit (IC) controller chip manufactured on an IC die. For example, IC controller 100 may be a single-chip IC device from the family of CCGx USB controllers developed by Cypress Semiconductor Corporation, San Jose, Calif. In another example, IC controller 100 may be a single-chip IC that is manufactured as a System-on-Chip (SoC).

Among other components, IC controller 100 may include CPU subsystem 102, peripheral interconnect 114, system resources 116, various input/output (I/O) blocks (e.g., 118A-118C), and USB subsystem 124. In addition, IC controller 100 provides circuitry and firmware that is configured and operable to support a number of power states 122. The CPU subsystem 102 may include one or more CPUs (central processing units) 104, flash memory 106, SRAM (Static Random Access Memory) 108, and ROM (Read Only Memory) 110 that are coupled to system interconnect 112. CPU 104 is a suitable processor that can operate in a system-on-chip device. In some embodiments, the CPU may be optimized for low-power operation with extensive clock gating and may include various internal controller circuits that allow the CPU to operate in various power states.

For example, the CPU may include a wake-up interrupt controller that is configured to wake the CPU from a sleep state, thereby allowing power to be switched "OFF" when the IC chip is in the sleep state. Flash memory 106 can be any type of program memory (e.g., NAND flash, NOR flash, and so forth) that is configurable for storing data and/or programs. SRAM 108 can be any type of volatile or non-volatile memory that is suitable for storing data and firmware/software instructions accessed by CPU 104. ROM 110 can be any type of suitable storage that is configurable for storing boot-up routines, configuration parameters, and other system-on-chip firmware parameters and settings. System interconnect 112 is a system bus (e.g., a single-level or multi-level Advanced High-Performance Bus, or AHB) that is configured as an interface that couples the various components of CPU subsystem 102 to each other, as well as a data and control interface between the various components of the CPU subsystem and peripheral interconnect 114.

Peripheral interconnect 114 is a peripheral bus (e.g., a single-level or multi-level AHB) that provides the primary data and control interface between CPU subsystem 102 and its peripherals and other resources, such as system resources 116, I/O blocks (e.g., 118A-118C), and USB subsystem 124. The peripheral interconnect may include various controller circuits (e.g., direct memory access, or DMA controllers), which may be programmed to transfer data between peripheral blocks without burdening the CPU subsystem. In various embodiments, each of the components of the CPU subsystem and the peripheral interconnect may be different with each choice or type of CPU, system bus, and/or peripheral bus.

System resources 116 may include various electronic circuits that support the operation of IC controller 100 in its various states and modes. For example, system resources 116 may include a power subsystem that provides the power resources required for each controller state/mode such as, for example, voltage and/or current references, wake-up interrupt controller (WIC), power-on-reset (POR), etc. In some embodiments, the power subsystem of system resources 116 may also include circuits that allow IC controller 100 to draw and/or provide power from/to external sources with several different voltage and/or current levels. System resources 116 may also include a clock subsystem that provides various clocks that are used by IC controller 100, as well as circuits that implement various controller functions such as external reset.

An IC controller, such as IC controller 100, may include various different types of I/O blocks and subsystems in various embodiments and implementations. For example, in the embodiment illustrated in FIG. 1, IC controller 100 may include GPIO (general purpose input output) blocks 118A, TCPWM (timer/counter/pulse-width-modulation) blocks 118B, SCBs (serial communication blocks) 118C, and USB subsystem 124. GPIOs 118A include circuits configured to implement various functions such as, for example, pull-ups, pull-downs, input threshold select, input and output buffer enabling/disabling, multiplex signals connected to various I/O pins, etc. TCPWMs 118B include circuits configured to implement timers, counters, pulse-width modulators, decoders and various other analog/mixed signal elements that are configured to operate on input/output signals. SCBs 118C include circuits configured to implement various serial communication interfaces such as, for example, I$^2$C, SPI (serial peripheral interface), UART (universal asynchronous receiver/transmitter), and so forth.

In certain embodiments, the USB subsystem 124 may be utilized in accordance with the techniques for reverse current protection described herein, and may also provide support for USB communications over USB ports, as well other USB functionality such as power delivery and battery charging. For example, in various embodiments USB subsystem 124 may be a USB-PD subsystem, a USB Type-C subsystem, or both (e.g., a USB Type-C subsystem that supports USB-PD functionality). USB subsystem 124 may include a Type-C transceiver and physical layer logic (PHY), which are configured as an integrated baseband PHY circuit to perform various digital encoding/decoding functions (e.g., Biphase Mark Code-BMC encoding/decoding, cyclical redundancy checks-CRC, and so forth) and analog signal processing functions involved in physical layer transmissions. The USB subsystem 124 may also be referred to as a USB controller.

In certain embodiments, the IC controller 100 (and/or the USB subsystem 124) may also be configured to respond to communications defined in a USB-PD Specification such as, for example, SOP, SOP', and SOP" messaging. As will be further discussed below, the USB subsystem 124 may also include reverse current protection circuitry 126 (e.g., on-chip circuitry included as part of the USB subsystem 124) and the overvoltage protection circuitry 128 (e.g., on-chip circuitry included as part of the USB subsystem 124) to protect one or more components of the IC controller 100 from possible electrical damage (e.g., overcurrent damage, overvoltage damage, overheating damage, and so forth) due to, for example, one or more electrical faults possibly occurring on the IC controller 100.

In USB-PD applications, two configuration channel terminals (or pins) (e.g., CC1/CC2) of USB Type-C connector, may be utilized for the detection of a type-C cable orientation. Once cable orientation detection is completed, for example, one CC terminal is used for providing V$_{CONN}$ voltage for cable/adapter power and the other CC terminal is used for USB-PD communication. The resistance across a V$_{CONN}$ power switch may be low (e.g., <500 mΩ) to support the maximum power delivery of, for example, 1.5 W over 5V. In some embodiments, the V$_{CONN}$ switch may be susceptible to a reverse current condition during a system level fault. In this fault condition, the V$_{BUS}$ line of a Type-C port (e.g., up to 24V) may short to the V$_{CONN}$ terminal. This may cause amps of current (e.g., which may be one or more orders of magnitude greater than normal rating currents) to flow through the V$_{CONN}$ switch. This reverse current may thus cause electrical and/or thermal damage (e.g., overcurrent damage, overheating damage, and so forth) to the V$_{CONN}$ switch as well as to the V$_{CONN}$ power source. In some embodiments, the V$_{CONN}$ switch may include a reverse current protection during system level fault. Thus, the present reverse current protection techniques may detect reverse current flow form pin V$_{CONN}$ to V$_{CONN}$ supply and then turn off the V$_{CONN}$ switch to avoid any potential electrical and/or thermal damage due to reverse current.

In certain embodiments, as will be discussed below with respect to FIGS. 2, 3A, 3B, and 4, for example, the reverse current protection circuitry 126 (e.g., on-chip circuitry) of the USB subsystem 124 may provide a V$_{CONN}$ switch reverse current detection and protection scheme that may protect, for example, the V$_{CONN}$ switch and V$_{CONN}$ power supply from electrical and/or thermal damage (e.g., overcurrent damage, reverse current damage, overheating damage, and so forth).

Figure 2:
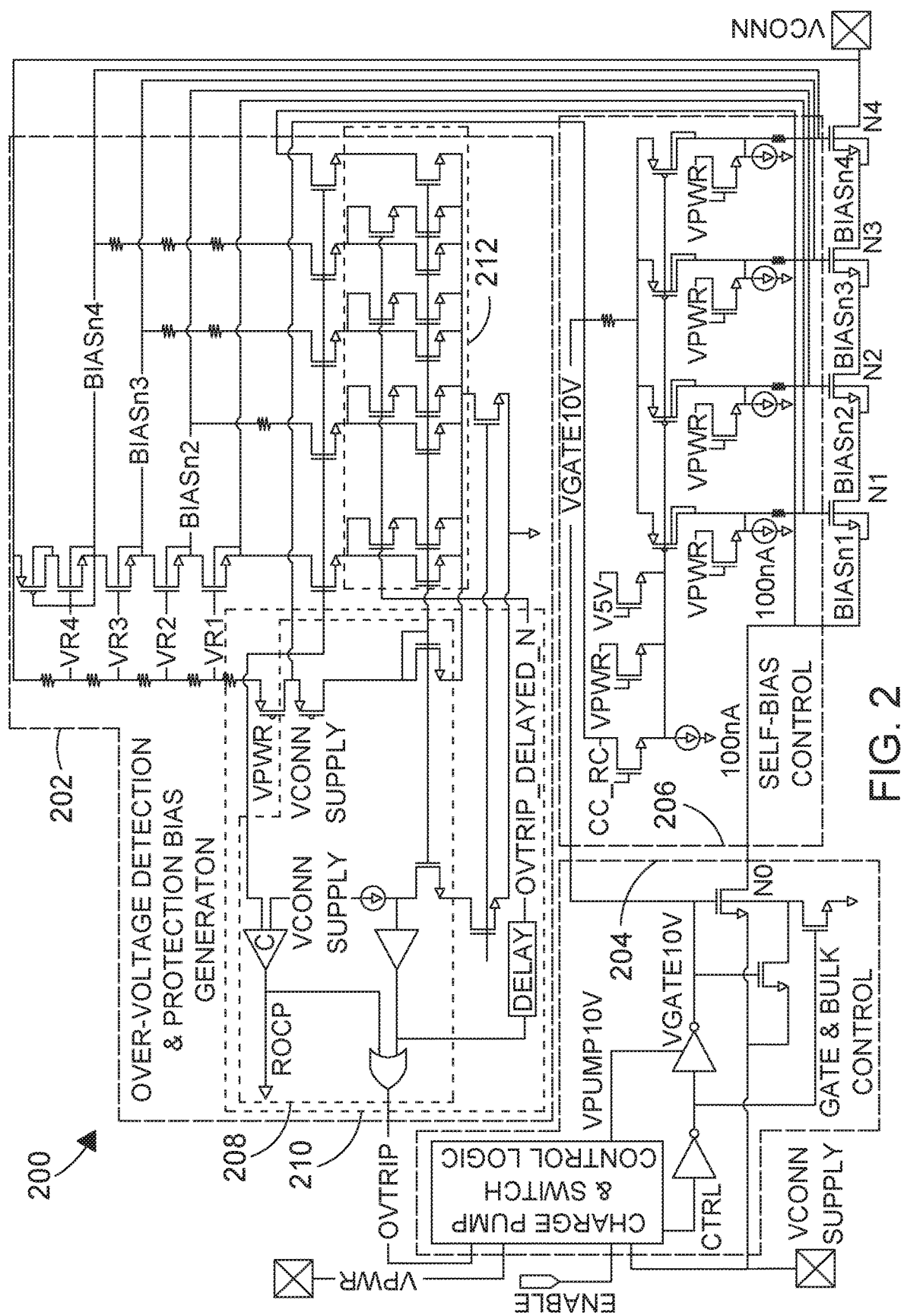
FIG. 2 is a detailed diagram that illustrates an IC controller system and USB-C connector systems, in accordance with the present embodiments.

Turning now to FIG. 2, a detailed embodiment of a USB subsystem 200 (e.g., USB Type-C subsystem) is provided. As depicted, the USB subsystem 200 (e.g., USB Type-C subsystem) may include a reverse current and overvoltage detection and protection circuit stage 202, a gate and bulk control circuit stage 204, and a self-bias control circuit stage 206. As depicted, the gate and bulk control circuit stage 204 may include various electronic components (e.g., charge pump and switch control logic, one or more amplifiers, one or more switches, and so forth) that may be utilized, for example, to turn "ON" the V$_{CONN}$ power-FETs by applying a gate voltage to one or more V$_{CONN}$ power-FETs. Similarly, the self-bias control circuit stage 206 may include (e.g., one or more power switches) that may be utilized, for example, to provide bias voltages to components of the reverse current and overvoltage detection and protection circuit stage 202.

The reverse current and overvoltage detection and protection circuit stage 202 may include on-chip reverse current detection and protection circuitry 208, comparator circuitry 210, and sink circuitry 212. In certain embodiments, as illustrated, the on-chip reverse current detection and protection circuitry 208 may include, for example, a comparator across a V$_{CONN}$ FET and V$_{CONN}$ supply. The gate and bulk control circuit stage 204 may include various electronic components (e.g., charge pump and switch control logic, one or more amplifiers, one or more switches, and so forth) that may be utilized, for example, to turn "ON" the V$_{CONN}$ power-FETs by applying a gate voltage to one or more V$_{CONN}$ power-FETs. Similarly, the self-bias control circuit stage 206 may include (e.g., one or more power switches) that may be utilized, for example, to provide bias voltages to components of the reverse current and overvoltage detection and protection circuit stage 202. In some embodiments, the gate and bulk control circuit stage 204 and the self-bias control circuit stage 206 may, in some embodiments, be utilized to support the overvoltage detection and protection circuit stage 202 to detect and compensate for overvoltage conditions.

In certain embodiments, as depicted, the comparator of the on-chip reverse current detection and protection circuitry 208 may output a reverse current protection signal (e.g., RCP) when, for example, the on-chip reverse current detection and protection circuitry 208 detects that $V_{CONN} > V_{CONN}$ supply. Whenever $V_{CONN}$ (up to 20V)>$V_{CONN}$ supply, the comparator input is clamped to VPWR+VTP (threshold voltage of PMOS whose gate connected to VPWR in circuit portion 210). Thus the comparator is protected from getting damaged during reverse current fault condition. VPWR is programmable supply or reference which determines reverse current detection threshold. In some embodiments, the comparator detection voltage threshold for $V_{CONN} > V_{CONN}$ supply may be user-configurable, and may be supplied by, for example, a programmable offset or a reference voltage. Specifically, the comparator of the on-chip reverse current detection and protection circuitry 208 may output the RCP signal to switch the $V_{CONN}$ FET switch "OFF" to protect the $V_{CONN}$ FET of the on-chip reverse current detection and protection circuitry 208 from electrically and/or thermally damaged due to reverse current at the $V_{CONN}$ FET.

Figures 3A, 3B:
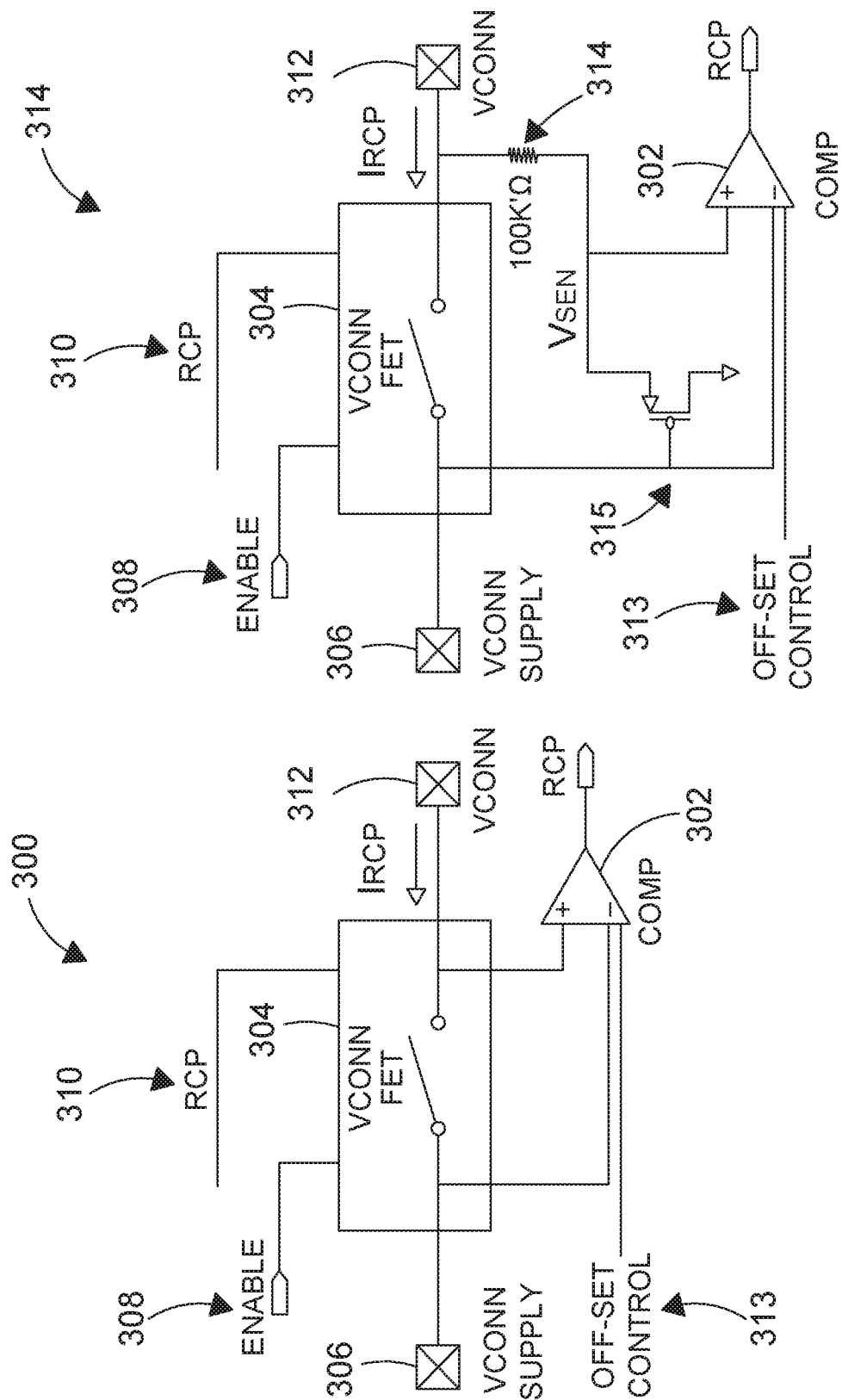
FIG. 3A is a diagram that illustrates an embodiment of a reverse current protection system for USB-C connector systems, in accordance with the present embodiments.
FIG. 3B is a diagram that illustrates another embodiment of a reverse current protection system for USB-C connector systems, in accordance with the present embodiments.

FIGS. 3A and 3B illustrate embodiments of an on-chip reverse current detection and protection circuitry (e.g., the on-chip reverse current detection and protection circuitry 208 as discussed above). For example, as illustrated by the on-chip reverse current detection and protection circuitry 300 of FIG. 3A, a comparator 302 may be provided across a $V_{CONN}$ FET switch 304 between a $V_{CONN}$ supply pin 306 and a $V_{CONN}$ pin 312. In some embodiments, $V_{CONN}$ FET 304 comprises a cascode N-channel FET configured to operate at approximately 3 volts (V). In other embodiments, $V_{CONN}$ FET 304 comprises a cascode N-channel FET configured to operate at approximately 5 volts (V). The $V_{CONN}$ FET 304 may receive an enable signal 308 to switch the $V_{CONN}$ FET 304 between "ON" and "OFF". Specifically, based on, for example, a programmable offset control signal 313 (e.g., voltage threshold value) and the measurement of the voltage across the $V_{CONN}$ FET 304 (e.g., when $V_{CONN} > V_{CONN}$ supply), the comparator 302 may provide a RCP signal 310 to the $V_{CONN}$ FET 304 as an indication to switch the $V_{CONN}$ FET 304 "OFF" to protect the $V_{CONN}$ FET 304 from sustaining electrical and/or thermal damage due to a reverse current (e.g., $I_{RCP}$) back-flowing into the $V_{CONN}$ FET 304.

FIG. 3B illustrates a high-voltage tolerant on-chip reverse current detection and protection circuitry 301 in accordance with the present reverse current protection techniques. For example, during operation of the illustrated embodiment of FIG. 3B under normal operating conditions, the voltage at the $V_{CONN}$ pin 312 voltage may be expected to be less than the voltage at the $V_{CONN}$ supply pin 306. Further, because there should be no current flowing through the resistor 314 (e.g., 100KΩ resistance) under normal operating conditions, the $V_{SEN}$ voltage (e.g., the voltage across the $V_{SEN}$ FET 315) should equal the voltage at $V_{CONN}$ pin 312. However, under fault conditions, the $V_{SEN}$ voltage may track the voltage at $V_{CONN}$ pin 312 (e.g., on the $V_{CONN}$ pin of the IC controller 100 as discussed with respect to FIG. 1) until it reaches the sum of the voltage at $V_{CONN}$ supply pin 306 and the $V_{FET\_TH}$ threshold voltage, and there is no current detected flowing through the resistor 314 (e.g., 100KΩ resistance). Once the voltate at the $V_{CONN}$ pin 312 rises above the sum of the voltage at $V_{CONN}$ supply pin 306 and the $V_{FET\_TH}$ threshold voltage, the $V_{SEN}$ FET 315 may clamp $V_{SEN}$ to a voltage equal to the sum of the voltage at the $V_{CONN}$ supply pin 306 voltage and the $V_{FET\_TH}$ threshold voltage. In this way, the comparator 302 does not see the high-voltage (e.g., 24V) that may be present on the $V_{CONN}$ pin 312.

Figure 4:
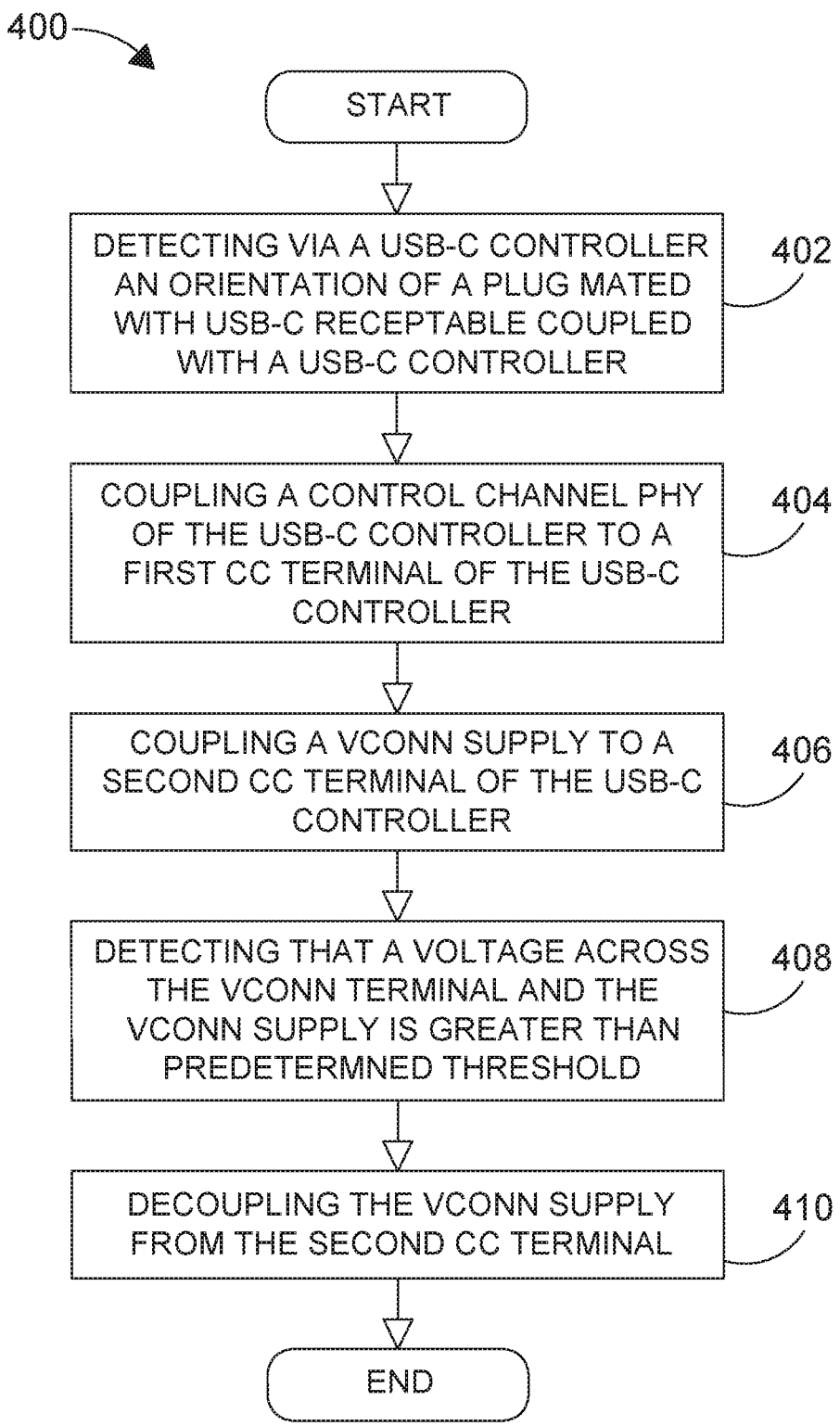
FIG. 4 is a flow diagram of a method of providing a reverse current protection scheme for USB-C connector systems, in accordance with the present embodiments.

Turning now to FIG. 4, which illustrates a flow diagram of a method 400 of providing reverse current detection and protection in accordance with the present embodiments. In certain embodiments, the method 400 may be performed by processing logic (e.g., IC controller 100 of FIG. 1 and IC controller 504 of FIG. 5) that may include hardware such as the USB subsystem 200 (e.g., USB Type-C subsystem) discussed above with respect to FIG. 2. Indeed, in some embodiments, the method 400 may be performed utilizing hardware, software, or combinations of hardware and software.

The method 400 may begin with the IC controller 100 detecting an orientation of a plug mated with a USB-C receptacle coupled with a USB-C controller (block 402). The method 400 may then continue with the IC controller 100 coupling a control channel PHY of the USB-C controller to a first CC terminal of the USB-C controller using a first switch (block 404). The method 400 may then continue with the IC controller 100 coupling a $V_{CONN}$ supply to a second CC terminal of the USB-C controller using a second switch (block 406). The method 400 may then continue with the IC controller 100 detecting that a reverse current flow from the $V_{CONN}$ terminal to the $V_{CONN}$ supply terminal is greater than a predetermined threshold amount (block 408). The method 400 may then continue with the IC controller 100 decoupling the $V_{CONN}$ supply from the second CC terminal (block 410). In this way, the present method 400 may provide a $V_{CONN}$ switch reverse current detection and protection scheme that may be utilized to protect, for example, the $V_{CONN}$ switch and $V_{CONN}$ supply from electrical and/or thermal damage (e.g., overcurrent damage, reverse current damage, overheating damage, and so forth).

The techniques for reverse current protection described herein may be embodied in several different types of USB Type-C applications. Examples of such types of Type-C applications include, but may not be limited to: a downstream facing port (DFP) USB application, in which an IC controller with a USB Type-C subsystem is configured to provide a downstream-facing USB port (e.g., in a USB-enabled host device); an upstream facing port (UFP) USB application, in which an IC controller with a USB Type-C subsystem may be utilized to provide an upstream-facing USB port (e.g., in a USB-enabled peripheral device or adapter); and a dual role port (DRP) USB application, in which an IC controller with a USB Type-C subsystem is configured to support both DFP and UFP applications on the same USB port.

Figure 5:
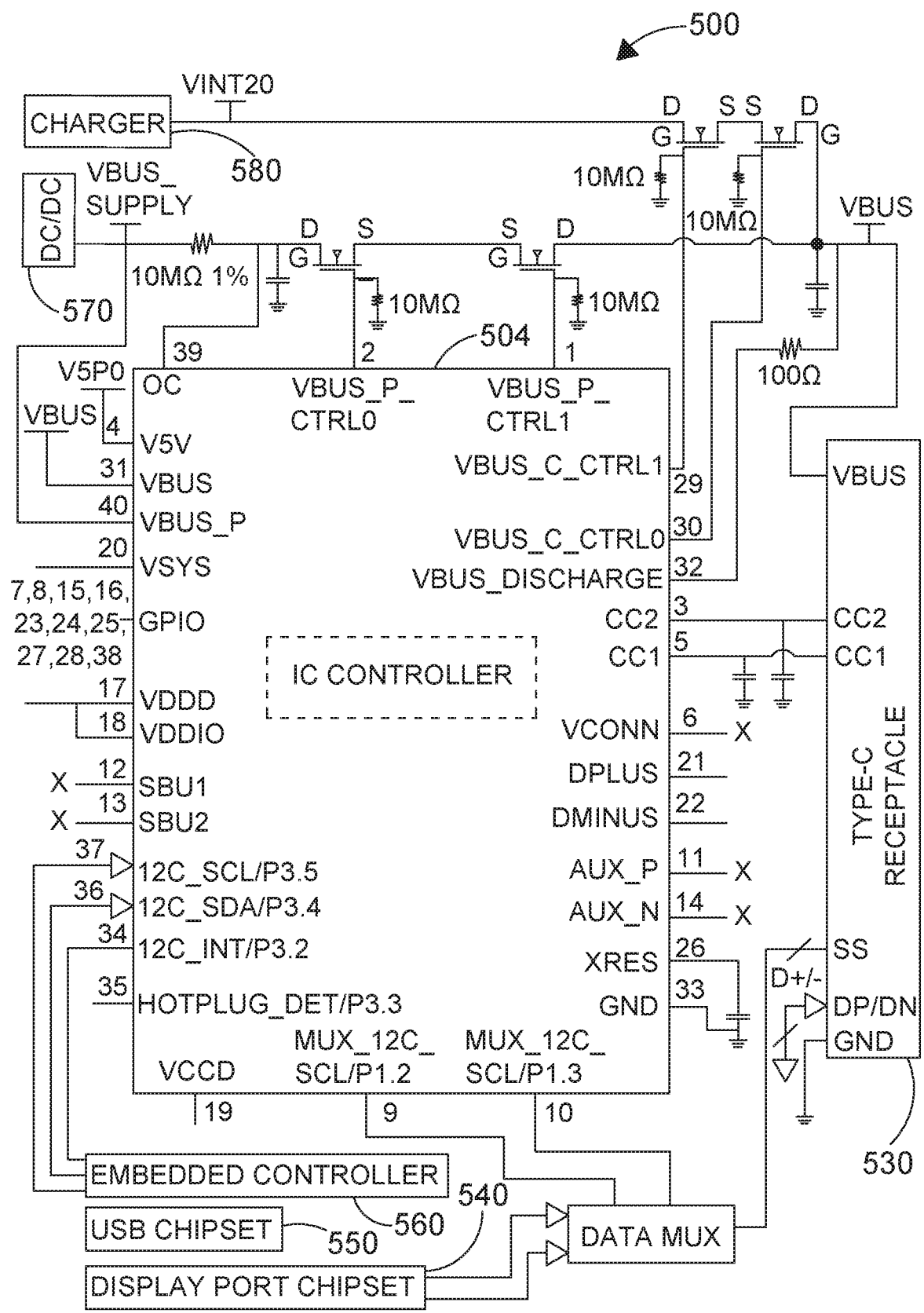
FIG. 5 is a block diagram of an example apparatus that may perform one or more of the operations described herein, in accordance with the present embodiments.

FIG. 5 illustrates an example system 500 in which IC controller 504 with a USB Type-C subsystem and/or a USB-PD subsystem is configured to provide a DRP application. In an example embodiment, IC controller 504 may be a single-chip IC device from the family of CCGx USB controllers developed by Cypress Semiconductor Corporation, San Jose, Calif. In system 500, IC controller 504 is coupled to Type-C receptacle 530, to display port chipset 540, to USB chipset 550, to embedded controller 560, to power supply 570, and to charger 580. These components of system 500 may be disposed on a printed circuit board (PCB) or other suitable substrate, and are coupled to each other by suitable means such conductive lines, traces, buses, etc.

In certain embodiments, the Type-C receptacle 530 may be configured in accordance with a USB Type-C specification to provide connectivity through a Type-C port. Display port chipset 540 is configured to provide a DisplayPort functionality through the Type-C receptacle 530. USB chipset 550 is configured to provide support for USB communications (e.g., such as USB 2.0 communications) through the D+/− lines of Type-C receptacle 530. Embedded controller 560 is coupled to IC controller 504 and is configured to provide various control and/or data transfer functions in system 500. The Power supply 570 may include a DC/DC power source that is coupled to the IC controller 504.

In certain embodiments, as previously discussed above, the IC controller 504 may include high-voltage tolerant on-chip reverse current detection and protection circuitry to carry out the reverse current protection techniques as described above. For example, as illustrated in FIG. 5, because the reverse current detection and protection circuitry is constructed as part of the IC controller 504 (e.g., on-chip), in some embodiments, singular PHY control channels may couple the respective CC1 and CC2 pins of the IC controller 504 via a "direct connection" (e.g., which may herein refer to an electric connection via or including a passive component such as a resistor or capacitor, but without any electrical connection via an active component such as a diode or transistor) to the respective CC1 and CC2 terminals of the Type-C receptacle 530.

Specifically, by enabling the respective CC1 and CC2 pins of IC controller 504 to be directly connected (e.g., without the utilization of any active electronic component, which further constitutes a reduction of hardware) to the respective CC1 and CC2 terminals of the Type-C receptacle 530 and by including the reverse current detection and protection circuitry as part of the IC controller 504 (e.g., on-chip), the present techniques may reduce, for example, response time, BOM, and power consumption of the system 500.

It should be understood that various embodiments may provide various mechanisms to facilitate the programmability, re-configurabilty, and/or re-programmability of an IC controller 504 (and of its various components) that operates in accordance with the techniques for reverse current protection described herein. Indeed, programmability may be used to alter thresholds, slew rates, current sensing sensitivity, and for adding conditions and functionality after production (e.g., for field upgrades). For example, some embodiments may store configuration and/or program data in logic circuits that are enabled/disabled by using resistor-based fuses that are trimmed when the IC controller 504 is manufactured. Examples of such fuses include laser fuses, e-fuses, and non-volatile latches that have some characteristics of fuses and some characteristics of non-volatile memory. In some embodiments, pin-strapping may be used to facilitate the programmability of the IC controller 504. A pin-strapping mechanism may involve connecting (e.g., via jumpers or PCB traces) a number of controller pins/terminals to power or ground to have each input provide a binary value to the IC controller 504, where the collection of the provided input values is used configuration data to configure or program one or more components of the IC controller 804.

In some embodiments, the configuration data for programming the IC controller 504 may be stored as a resistor configuration storage. For example, a set of resistors may be connected between a set of pins/terminals of the IC controller 504 and power or ground, to create a voltage or current that can be measured by an ADC to produce a binary value to configure one or more parameters of the controller. In other embodiments, the configuration data for programming the IC controller 504 may be provided as a mask ROM or a metal mask. For example, a chip manufacturer can customize a particular batch of IC controller 504 chips by changing the connections of pre-defined internal nodes between a "1" and a "0" using a single lithographic mask that is specific to that custom configuration with other masks remaining unchanged between batches, thereby providing custom configuration parameters for the particular batch of controllers.

It should be understood that various embodiments may provide various types of programmability for an IC controller 504 (and of its components) that operates in accordance with the techniques for reverse current protection described herein. For example, some embodiments may provide dynamic programmability, in which configuration changes are re-programmed in the course of normal operation of the IC controller 504, usually (but not necessarily always) in response to a change in one or more operating conditions or an external command and based on data previously programmed into the controller. Other embodiments may use in-system programmability, in which configuration changes are re-programmed in the course of normal operation of the IC controller 504 in response to an external command and based on new configuration data downloaded into the controller in association of the command. In some embodiments, the IC controller 504 may be factory-programmed as part of its manufacture or as part of the manufacture of an end product (e.g., such as a power adapter, a wall socket, a car charger, a power bank, etc.). For example, the IC controller 504 may be programmed during manufacture by using various mechanisms such as firmware instructions stored in non-volatile memory, pin-strapping, resistor programming, laser-trimmed fuses, NV latches, or OTP registers.

Unless specifically stated otherwise, terms such as "detecting," "decoupling," "coupling," or the like, refer to actions and processes performed or implemented by computing devices that manipulates and transforms data represented as physical (electronic) quantities within the computing device's registers and memories into other data similarly represented as physical quantities within the computing device memories or registers or other such information storage, transmission or display devices. Also, the terms "first," "second," "third," "fourth," etc., as used herein are meant as labels to distinguish among different elements and may not necessarily have an ordinal meaning according to their numerical designation.

The methods and illustrative examples described herein are not inherently related to any particular computer or other apparatus. Various general purpose systems may be used in accordance with the teachings described herein, or it may prove convenient to construct more specialized apparatus to perform the required method steps. The required structure for a variety of these systems will appear as set forth in the description above.

The above description is intended to be illustrative, and not restrictive. Although the present disclosure has been described with references to specific illustrative examples, it will be recognized that the present disclosure is not limited to the examples described. The scope of the disclosure should be determined with reference to the following claims, along with the full scope of equivalents to which the claims are entitled.

As used herein, the singular forms "a", "an" and "the" are intended to include the plural forms as well, unless the context clearly indicates otherwise. It will be further understood that the terms "comprises", "comprising", "may include", and/or "including", when used herein, specify the presence of stated features, integers, steps, operations, elements, and/or components, but do not preclude the presence or addition of one or more other features, integers, steps, operations, elements, components, and/or groups thereof.

Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component.

Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. An electronic device, comprising:
a first electronic circuitry portion configured to connect a $V_{CONN}$ supply terminal of a Universal Serial Bus Type-C (USB-C) controller to a first configuration channel (CC) terminal of a plurality of CC terminals of the USB-C controller, during normal operation the first CC terminal being driven to a $V_{CONN}$ output voltage that is less than a $V_{CONN}$ supply voltage of the $V_{CONN}$ supply terminal, the first CC terminal of the USB-C controller to be directly connected to a first CC terminal of a plurality of CC terminals of a USB-C receptacle, the USB-C receptacle including a $V_{BUS}$ power supply terminal having a higher voltage than the first CC terminal of the USB-C controller; and
a second electronic circuitry portion electrically coupled to the first electronic circuitry portion and configured to:
compare a voltage across the first CC terminal of the USB-C controller and the $V_{CONN}$ supply terminal to detect a short circuit between the first CC terminal of the USB-C controller and the $V_{BUS}$ power supply terminal; and
decouple the $V_{CONN}$ supply terminal from the first CC terminal of the USB-C controller when the $V_{CONN}$ output voltage at the first CC terminal of the USB-C controller is greater than the $V_{CONN}$ supply voltage at the $V_{CONN}$ supply terminal by a predetermined threshold due to the short circuit.

2. The electronic device of claim 1, wherein the plurality of CC terminals of the USB-C controller comprises a pair of CC terminals of the USB-C controller.

3. The electronic device of claim 1, wherein the plurality of CC terminals of the USB-C receptacle comprises a pair of CC terminals of the USB-C receptacle.

4. The electronic device of claim 1, wherein the second electronic circuitry portion is configured to detect a reverse current flowing from the first CC terminal of the USB-C controller to the $V_{CONN}$ supply terminal based at least in part on the voltage.

5. The electronic device of claim 1, wherein the second electronic circuitry portion is configured to detect the voltage across a $V_{CONN}$ field-effect transistor (FET) disposed between the first CC terminal of the USB-C controller and the $V_{CONN}$ supply terminal.

6. The electronic device of claim 5, wherein the $V_{CONN}$ FET comprises a cascode N-channel FET configured to operate at approximately 3 volts (V).

7. The electronic device of claim 5, wherein the $V_{CONN}$ FET comprises a cascode N-channel FET configured to operate at approximately 5 volts (V).

8. The electronic device of claim 1, wherein the voltage comprises an indication of a reverse overcurrent condition.

9. The electronic device of claim 1, wherein the predetermined threshold comprises a programmable threshold.

10. A system, comprising:
a first electronic circuitry portion configured to connect a $V_{CONN}$ supply terminal of a Universal Serial Bus Type-C (USB-C) controller to a first configuration channel (CC) terminal of a plurality of CC terminals of the USB-C controller, during normal operation the first CC terminal being driven to a $V_{CONN}$ output voltage that is less than a $V_{CONN}$ supply voltage of the $V_{CONN}$ supply terminal;
a USB-C receptacle comprising a plurality of CC terminals and a $V_{BUS}$ power supply terminal, wherein a first CC terminal of the plurality of CC terminals of a USB-C receptacle is configured to directly connect to the first CC terminal of the USB-C controller, and wherein the $V_{BUS}$ power supply terminal has a higher voltage than the first CC terminal of the USB-C controller; and a second electronic circuitry portion electrically coupled to the first electronic circuitry portion and the USB-C receptacle, and configured to:

compare a voltage across the first CC terminal of the USB-C controller and the $V_{CONN}$ supply terminal to detect a short circuit between the first CC terminal of the USB-C controller and the $V_{BUS}$ power supply terminal; and decouple the $V_{CONN}$ supply terminal from the first CC terminal of the USB-C controller when the $V_{CONN}$ output voltage at the first CC terminal of the USB-C controller is greater than the $V_{CONN}$ supply voltage at the $V_{CONN}$ supply terminal by a predetermined threshold due to the short circuit.

11. The system of claim 10, wherein the second electronic circuitry portion is configured to detect a reverse current flowing from the first CC terminal of the USB-C controller to the $V_{CONN}$ supply terminal based at least in part on the voltage.

12. The system of claim 10, wherein the second electronic circuitry portion is configured to detect the voltage across a $V_{CONN}$ field-effect transistor (FET) disposed between the first CC terminal of the USB-C controller and the $V_{CONN}$ supply terminal.

13. The system of claim 12, wherein the $V_{CONN}$ FET comprises a cascode N-channel FET configured to operate at approximately 3 volts (V).

14. The system of claim 12, wherein the $V_{CONN}$ FET comprises a cascode N-channel FET configured to operate at approximately 5 volts (V).

15. The system of claim 10, wherein the predetermined threshold comprises a programmable threshold.

* * * * *